(12) United States Patent
Ai

(10) Patent No.: US 10,637,017 B2
(45) Date of Patent: Apr. 28, 2020

(54) FLEXIBLE BATTERY STRUCTURE

(71) Applicant: Apple Inc., Cupertino, CA (US)

(72) Inventor: Jiang Ai, San Jose, CA (US)

(73) Assignee: Apple Inc., Cupertino, CA (US)

(*) Notice: Subject to any disclaimer, the term of this patent is extended or adjusted under 35 U.S.C. 154(b) by 99 days.

(21) Appl. No.: 15/713,537

(22) Filed: Sep. 22, 2017

(65) Prior Publication Data

US 2018/0090730 A1 Mar. 29, 2018

Related U.S. Application Data

(60) Provisional application No. 62/399,298, filed on Sep. 23, 2016.

(51) Int. Cl.
*H01M 2/10* (2006.01)
*H01M 10/04* (2006.01)
*H05K 5/00* (2006.01)
*H05K 5/02* (2006.01)

(52) U.S. Cl.
CPC ..... *H01M 2/1061* (2013.01); *H01M 10/0436* (2013.01); *H05K 5/0017* (2013.01); *H05K 5/0086* (2013.01); *H05K 5/0217* (2013.01); *H01M 2/1066* (2013.01); *H01M 2220/30* (2013.01)

(58) Field of Classification Search
None
See application file for complete search history.

(56) References Cited

U.S. PATENT DOCUMENTS

| 2,798,895 | A | 7/1957 | Nowotny |
| 2,798,896 | A | 7/1957 | Bly |
| 4,152,825 | A | 5/1979 | Bruneau |
| 4,344,603 | A | 8/1982 | Hozumi et al. |
| 4,455,026 | A | 6/1984 | Pinkus et al. |
| 5,238,222 | A | 8/1993 | Sumida et al. |
| 5,531,601 | A | 7/1996 | Amoroso |
| 5,580,676 | A | 12/1996 | Honda et al. |
| 6,106,973 | A | 8/2000 | Tsutomo Sonozaki et al. |
| 6,174,164 | B1 | 1/2001 | Masjedi |
| 6,358,644 | B1 | 3/2002 | Shibata et al. |
| 6,368,744 | B1 | 4/2002 | Hatazawa et al. |

(Continued)

FOREIGN PATENT DOCUMENTS

| CN | 1508892 | 6/2004 |
| CN | 100541867 | 9/2009 |

(Continued)

OTHER PUBLICATIONS

U.S. Appl. No. 15/156,013, "Non-Final Office Action", dated Mar. 15, 2018, 11 pages.

(Continued)

*Primary Examiner* — Sarah A. Slifka
(74) *Attorney, Agent, or Firm* — Kilpatrick Townsend & Stockton LLP

(57) ABSTRACT

A number of different battery cell configurations are disclosed. Flexible battery cells are used to form a flexible structure capable of bending and flexing to accommodate movement of components of an electronic device. In some embodiments, the flexible battery cells can include cathode and anode layers joined together by a separator.

18 Claims, 7 Drawing Sheets

(56) References Cited

U.S. PATENT DOCUMENTS

| | | |
|---|---|---|
| 6,528,204 B1 | 3/2003 | Hikmet et al. |
| 6,549,756 B1 | 4/2003 | Engstrom |
| 6,790,178 B1 | 9/2004 | Mault et al. |
| 6,924,551 B2 | 8/2005 | Rumer et al. |
| 7,103,407 B2 | 9/2006 | Hjelt et al. |
| 7,270,910 B2 | 9/2007 | Yahnker et al. |
| 7,288,340 B2 | 10/2007 | Iwamoto |
| 7,356,923 B2 | 4/2008 | Honer |
| 7,622,895 B1 | 11/2009 | Griffin |
| 7,663,064 B2 | 2/2010 | Dutta et al. |
| 7,714,542 B2 | 5/2010 | Lee et al. |
| 7,887,948 B2 | 2/2011 | Jang et al. |
| 7,910,243 B2 | 3/2011 | Koh et al. |
| 7,948,208 B2 | 5/2011 | Partovi et al. |
| 7,952,322 B2 | 5/2011 | Partovi et al. |
| 7,972,721 B2 | 7/2011 | Kozu et al. |
| 7,976,981 B2 | 7/2011 | Lee |
| 8,031,122 B2 | 10/2011 | Jang et al. |
| 8,034,477 B2 | 10/2011 | Yamada |
| 8,119,278 B2 | 2/2012 | Bailey et al. |
| 8,124,269 B2 | 2/2012 | Takahashi et al. |
| 8,169,185 B2 | 5/2012 | Partovi et al. |
| 8,241,786 B2 | 8/2012 | Taniguchi et al. |
| 8,259,013 B2 | 9/2012 | Jang et al. |
| 8,260,371 B2 | 9/2012 | Kawata et al. |
| 8,293,402 B2 | 10/2012 | Lee |
| 8,345,420 B2 | 1/2013 | McClure et al. |
| 8,427,825 B2 | 4/2013 | Szczypinski |
| 8,445,125 B2 | 5/2013 | Baek |
| 8,518,569 B2 | 8/2013 | Murphy et al. |
| 8,526,998 B2 | 9/2013 | Koide et al. |
| 8,558,509 B2 | 10/2013 | He et al. |
| 8,603,670 B2 | 12/2013 | Taniguchi et al. |
| 8,629,652 B2 | 1/2014 | Partovi et al. |
| 8,629,654 B2 | 1/2014 | Partovi et al. |
| 8,679,674 B2 | 3/2014 | Liang et al. |
| 8,778,529 B2 | 7/2014 | Seo |
| 8,890,470 B2 | 11/2014 | Partovi |
| 8,896,264 B2 | 11/2014 | Partovi |
| 8,901,881 B2 | 12/2014 | Partovi |
| 8,920,949 B2 | 12/2014 | Hashimoto et al. |
| 8,936,653 B2 | 1/2015 | Kim et al. |
| 8,942,409 B2 | 1/2015 | Kantor et al. |
| 8,947,047 B2 | 2/2015 | Partovi et al. |
| 8,989,821 B2 | 3/2015 | Jarvis et al. |
| 8,999,566 B2 | 4/2015 | Chung et al. |
| 9,040,192 B2 | 5/2015 | Lee et al. |
| 9,106,083 B2 | 8/2015 | Partovi |
| 9,112,362 B2 | 8/2015 | Partovi |
| 9,112,363 B2 | 8/2015 | Partovi |
| 9,112,364 B2 | 8/2015 | Partovi |
| 9,136,510 B2 | 9/2015 | Werner |
| 9,172,088 B2 | 10/2015 | Han et al. |
| 9,178,369 B2 | 11/2015 | Partovi |
| 9,301,034 B2 | 3/2016 | Kantor et al. |
| 9,343,716 B2 | 5/2016 | Rothkopf et al. |
| 2002/0094475 A1 | 7/2002 | Aoyama |
| 2003/0129483 A1 | 7/2003 | Gross |
| 2003/0170535 A1 | 9/2003 | Watanabe et al. |
| 2004/0119442 A1 | 6/2004 | Lee et al. |
| 2004/0229442 A1 | 11/2004 | Choi |
| 2005/0108750 A1 | 5/2005 | Nishikawa et al. |
| 2005/0142439 A1 | 6/2005 | Lee et al. |
| 2005/0202310 A1 | 9/2005 | Yahnker et al. |
| 2006/0008698 A1 | 1/2006 | Kim et al. |
| 2007/0072071 A1 | 3/2007 | Lee et al. |
| 2007/0154794 A1 | 7/2007 | Kim et al. |
| 2007/0260136 A1 | 11/2007 | Hunter et al. |
| 2007/0264535 A1 | 11/2007 | Lee et al. |
| 2008/0001573 A1 | 1/2008 | Carey |
| 2008/0003491 A1 | 1/2008 | Yahnker et al. |
| 2008/0286644 A1 | 11/2008 | Yeo |
| 2009/0246620 A1 | 10/2009 | Lee et al. |
| 2009/0317708 A1 | 12/2009 | Brandl et al. |
| 2010/0052603 A1 | 3/2010 | Bourilkov et al. |
| 2010/0081049 A1 | 4/2010 | Holl et al. |
| 2010/0099020 A1 | 4/2010 | Ouwerkerk et al. |
| 2010/0316911 A1 | 12/2010 | Tesson et al. |
| 2011/0014954 A1 | 1/2011 | Dossas et al. |
| 2011/0043309 A1 | 2/2011 | Wamala et al. |
| 2011/0050164 A1 | 3/2011 | Partovi et al. |
| 2011/0076550 A1 | 3/2011 | Liang et al. |
| 2011/0175569 A1 | 7/2011 | Austin |
| 2011/0210954 A1 | 9/2011 | Murphy et al. |
| 2011/0215480 A1 | 9/2011 | Gorczyca et al. |
| 2011/0221385 A1 | 9/2011 | Partovi et al. |
| 2011/0223447 A1 | 9/2011 | Ignor et al. |
| 2011/0236727 A1 | 9/2011 | Jang |
| 2011/0287318 A1 | 11/2011 | Loveness et al. |
| 2012/0116176 A1 | 5/2012 | Moravec et al. |
| 2012/0121944 A1 | 5/2012 | Yamamoto et al. |
| 2012/0305605 A1 | 12/2012 | Vassaux et al. |
| 2013/0034763 A1 | 2/2013 | Byun |
| 2013/0053110 A1 | 2/2013 | Pope et al. |
| 2013/0071696 A1 | 3/2013 | Kim et al. |
| 2013/0093388 A1 | 4/2013 | Partovi |
| 2013/0099563 A1 | 4/2013 | Partovi et al. |
| 2013/0171490 A1* | 7/2013 | Rothkopf ............ H01M 2/0207 429/120 |
| 2013/0249479 A1 | 9/2013 | Partovi |
| 2013/0260677 A1 | 10/2013 | Partovi |
| 2013/0271069 A1 | 10/2013 | Partovi |
| 2013/0285604 A1 | 10/2013 | Partovi et al. |
| 2013/0285605 A1 | 10/2013 | Partovi et al. |
| 2013/0300204 A1 | 11/2013 | Partovi et al. |
| 2013/0323055 A1 | 12/2013 | Eden et al. |
| 2014/0050948 A1 | 2/2014 | Hashimoto et al. |
| 2014/0065474 A1 | 3/2014 | Werner et al. |
| 2014/0103873 A1 | 4/2014 | Partovi et al. |
| 2014/0132210 A1 | 5/2014 | Partovi et al. |
| 2014/0147703 A1 | 5/2014 | Werner et al. |
| 2014/0147730 A1 | 5/2014 | Werner et al. |
| 2014/0191568 A1 | 7/2014 | Partovi et al. |
| 2014/0306654 A1 | 10/2014 | Partovi et al. |
| 2015/0043156 A1 | 2/2015 | Jain et al. |
| 2015/0130412 A1 | 5/2015 | Partovi |
| 2015/0145475 A1 | 5/2015 | Partovi et al. |
| 2015/0185055 A1 | 7/2015 | King |
| 2015/0220109 A1 | 8/2015 | Von Badinski et al. |
| 2015/0255776 A1 | 9/2015 | Dabov |
| 2015/0256007 A1 | 9/2015 | Zadesky et al. |
| 2016/0064780 A1 | 3/2016 | Jarvis et al. |
| 2016/0080614 A1 | 3/2016 | Hollinger |
| 2016/0260945 A1 | 9/2016 | Rothkopf et al. |

FOREIGN PATENT DOCUMENTS

| | | |
|---|---|---|
| CN | 101622743 | 1/2010 |
| CN | 101702412 | 5/2010 |
| EP | 792741 | 9/1997 |
| EP | 1331681 | 7/2003 |
| EP | 1931010 | 6/2008 |
| EP | 2540221 | 1/2013 |
| EP | 2653053 | 10/2013 |
| JP | 61032951 | 7/1986 |
| JP | 10012200 | 1/1988 |
| JP | 63314770 | 12/1988 |
| JP | 2000058018 | 2/2000 |
| JP | 2001118547 | 4/2001 |
| JP | 2001250515 | 9/2001 |
| JP | 2001250516 | 9/2001 |
| JP | 2001332752 | 11/2001 |
| JP | 2005129260 | 5/2005 |
| JP | 2005268138 | 9/2005 |
| JP | 2007048725 | 2/2007 |
| JP | 2007165200 | 6/2007 |
| JP | 2010021074 | 1/2010 |
| JP | 2010536246 | 11/2010 |
| KR | 1020010007769 | 2/2001 |
| KR | 1020090075396 | 7/2009 |
| KR | 1020110100836 | 9/2011 |
| WO | 0041252 | 7/2000 |

(56) References Cited

FOREIGN PATENT DOCUMENTS

| WO | 2008023199 | 2/2008 |
| WO | 2011000239 | 1/2011 |
| WO | 2011095758 | 8/2011 |

OTHER PUBLICATIONS

Chinese Patent Application No. 201610563029.X, "Office Action", dated Apr. 18, 2018, 9 pages.

\* cited by examiner

FLEXIBLE BATTERY STRUCTURE

CROSS-REFERENCES TO RELATED APPLICATIONS

This application claims priority to U.S. Provisional Patent Application No. 62/399,298, filed on Sep. 23, 2016 and entitled "FLEXIBLE BATTERY STRUCTURE", the disclosure of which is hereby incorporated by reference in its entirety for all purposes.

FIELD

This disclosure relates generally to flexible batteries. In particular, a number of laminated flexible battery structures are disclosed.

BACKGROUND

Batteries often take up a substantial amount of space in a portable electronic device. As devices have grown increasingly more power hungry, greater amounts of space need to be dedicated to accommodate space for the batteries. In addition to taking up space, the batteries are also often quite rigid, often making placement of the batteries in portions of a device designed to bend impractical. For this reason, it would be desirable to have a flexible or semi-flexible battery for use with a portable electronic device.

SUMMARY

This disclosure describes various embodiments that relate to a flexible battery.

A flexible battery is disclosed and includes the following: a flexible substrate; and battery cells distributed across the flexible substrate, each of the batter cells extending across a portion of the flexible substrate and aligned so that each of the battery cells is substantially parallel with the other battery cells. The battery cells are separated from adjacent battery cells by an interval that allows the flexible substrate to bend about one axis.

A flexible battery is disclosed and includes the following: a first stack of flexible battery cells; a second stack of flexible battery cells; and spacing elements positioned between and coupling the first and second stacks of flexible battery cells, the spacing elements creating multiple air gaps between the first and second stacks of battery cells.

A battery is disclosed and includes the following: flexible battery cells arranged in a stack and having a serpentine geometry that accommodates bending of the flexible battery cells about three orthogonal axes, each one of the flexible battery cells comprising: an anode layer; a cathode layer; and a separator joining the anode layer to the cathode layer.

An electronic device is disclosed and includes the following: a flexible housing member; and a flexible battery disposed within the flexible housing member, the flexible battery comprising: flexible battery cells arranged in a stack and defining stress-relieving gaps that accommodate bending of the flexible battery cells about multiple axes of rotation, each one of the flexible battery cells comprising an anode layer, a cathode layer and a separator disposed between the anode and cathode layers.

An electronic device is disclosed and includes the following: a device housing; a display assembly, comprising: a flexible display; and flexible battery cells arranged in a stack and having a serpentine geometry that accommodates bending of the flexible battery cells about three orthogonal axes, each one of the flexible battery cells comprising: an anode layer; a cathode layer; and a separator joining the anode layer to the cathode layer.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
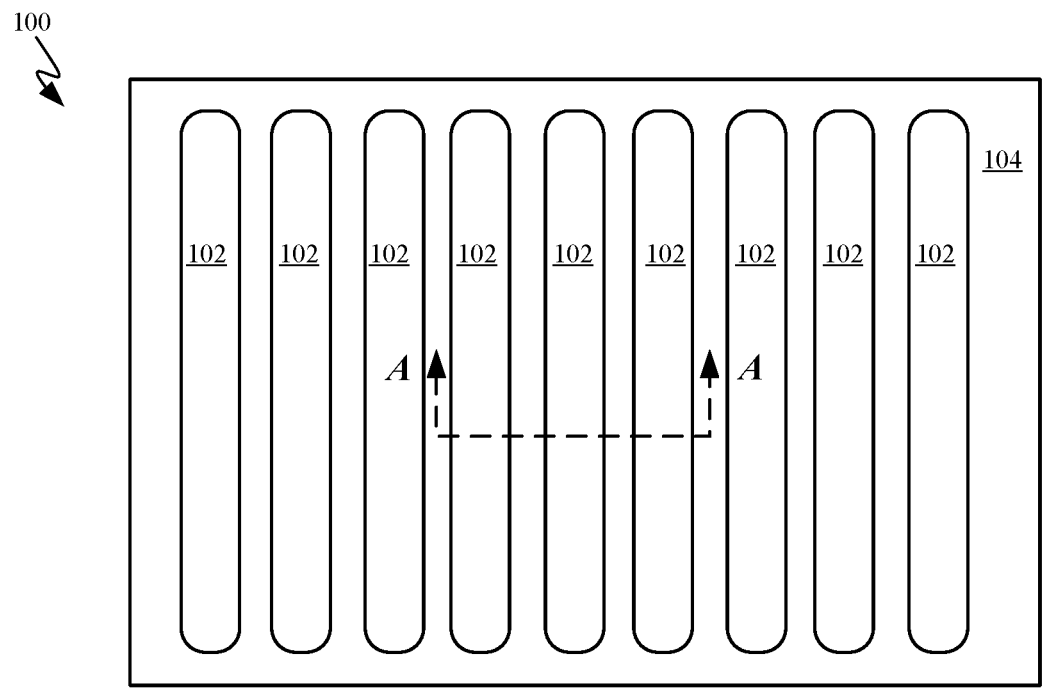
FIG. 1A shows a top view of a layer of a flexible battery.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Portable electronic devices generally use a battery to provide the power to carryout various functions when not receiving external power. Unfortunately, as the functionality of portable electronic devices has grown so has the size of the batteries needed to keep the devices functioning over the course of a day. A battery typically used in a portable electronic device tends to occupy a large volume within the device. When the battery is rigid and unable to withstand substantial amounts of bending, the substantial portion of the device that surrounds the battery is also unable to bend.

A battery can be formed using flexible battery cells. The flexible battery cells can be created using a flexible film design. In some embodiment, the flexible film design can take the form of a prismatic cell. The prismatic cell can include a flexible cathode layer separated from a flexible anode layer by a flexible separator. The prismatic cells are combined to form a battery by stacking the flexible battery cells or rolling the flexible battery cells up into a cylinder. While this does offer more variations in shape than a conventional battery, the final shape of the battery still tends to be fairly rigid.

One solution to this problem is to separate the flexible battery cells into discrete regions. For example, the flexible battery cells can be rolled up into discrete cylinders and then distributed across a flexible substrate. Depending on the interval between the discrete cylinders and diameter of the discrete cylinders, the resulting battery can be flex about at least one axis. In some embodiments, a stack of flexible battery cells can be interspersed with air gaps that allow for a greater amount of flexibility of the resulting flexible battery. In some embodiments, a battery cell can be formed from a stack of flexible battery cells that are die cut to allow the resulting flexible battery to bend and flex about multiple axes.

In general, the size and density of the flexible battery cells within the flexible battery can be adjusted to suit the application. For example, a flexible battery designed to accommodate a feature that folded in one location could have a different design than a flexible battery designed to be incorporated into a flexible sheet subject to bending, folding or rolling in any number of directions.

These and other embodiments are discussed below with reference to FIGS. 1A-5B; however, those skilled in the art will readily appreciate that the detailed description given herein with respect to these figures is for explanatory purposes only and should not be construed as limiting.

FIG. 1A shows a top view of a layer 100 of a flexible battery. Layer 100 includes an arrangement of battery cells 102 distributed across flexible substrate 104. Each of battery cells 102 can be elongated and oriented in the same direction. The interval between adjacent battery cells 102 allows the layer to bend.

Figure 1B:
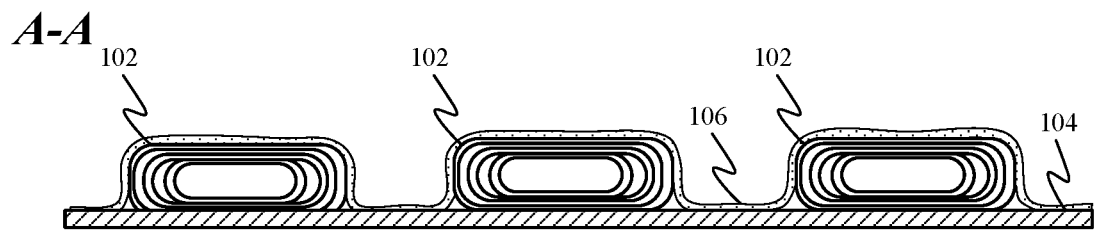
FIG. 1B shows a cross-sectional view of the layer depicted in FIG. 1A in accordance with section line A-A.

FIG. 1B shows a cross-sectional view of layer 100 in accordance with section line A-A. Battery cell 102 is depicted as flexible battery cell rolled up into a flattened, cylindrical geometry and laminated between flexible substrate 104 and a protective layer 106. It should be noted that while a flexible battery cell is depicted, other less flexible battery cell technologies that fit into a similar space could also be used in this embodiment.

Figure 1C:
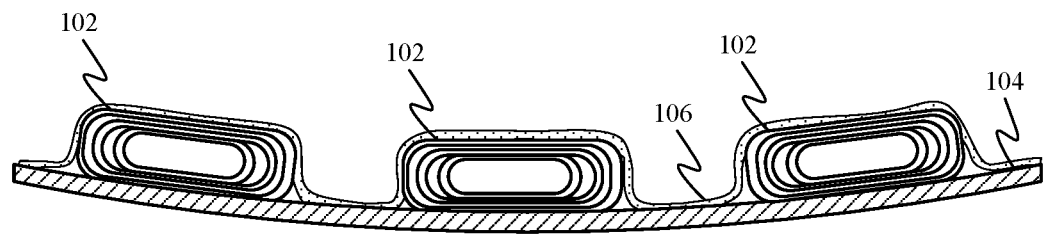
FIGS. 1C-1D show how the layer is capable of bending in two directions.
Figure 1D:
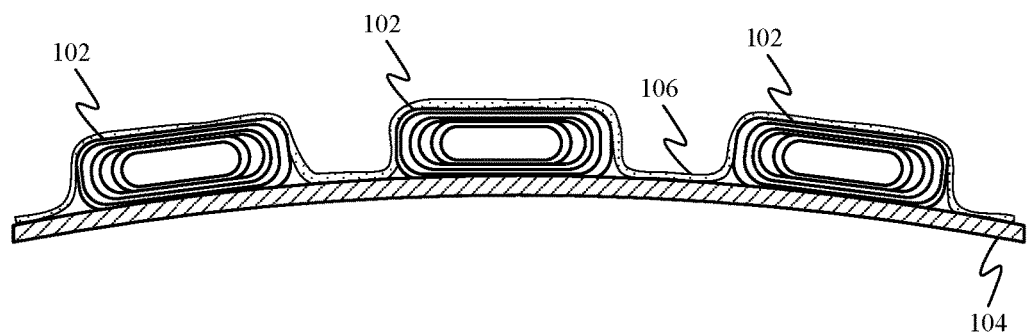
Figure 1E:
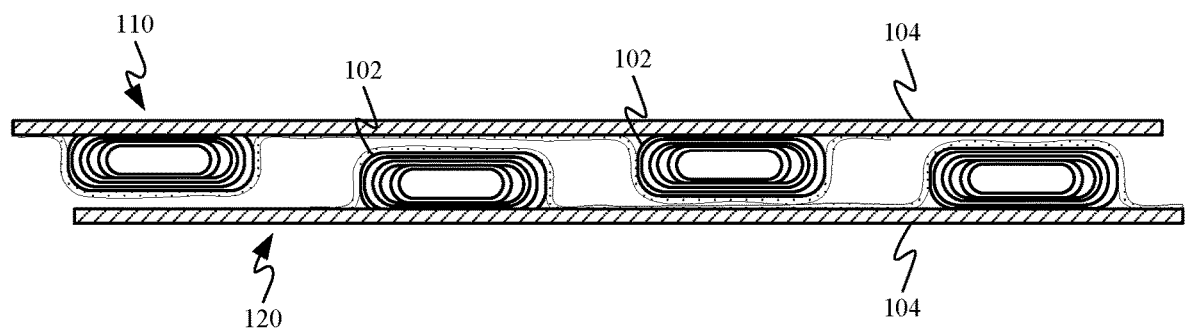
FIG. 1E shows how two layers can be stacked together without taking up substantially more room than one layer would take up.

FIGS. 1C-1D show how layer 100 is capable of bending in two directions. The rigidity of battery cells 102 would tend to prevent bending or folding of layer 100 about an axis that crossed two or more of battery cells 102. FIG. 1E shows how layers 110 and 120 can be stacked together without taking up substantially more room than one layer would take up. A flexible battery could include numerous layers of battery cells. For example, in some embodiments, each of the layers could be between 100 and 200 microns in thickness while the layers could combine to take up 2 to 3 mm in thickness.

Figure 2A:
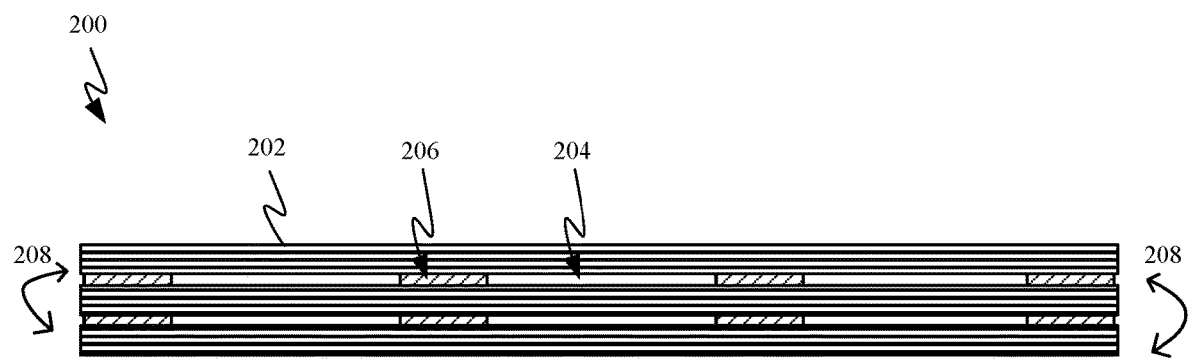
FIG. 2A shows an alternative flexible battery that includes multiple layers.

FIG. 2A shows an alternative flexible battery 200 that includes multiple layers 202. Each of layers 202 can include multiple flexible battery cells stacked together in a sheet. In some embodiments, the battery cells can be laminated together by a pressure sensitive adhesive (PSA) that has a particularly low Young's Modulus on the order of about 0.5 MPa, which allows the laminated battery cells to shift in relation to each other without generating substantial amounts of inter-cell stress. In order to maintain a flexibility of flexible battery 200, air gaps 204 can be distributed between layers 202 of flexible battery 200. Spacing elements 206 can be interspersed between layers 202 in order to establish air gaps 204. Air gaps accommodate bending of flexible battery in accordance with arrows 208.

Figure 2B:
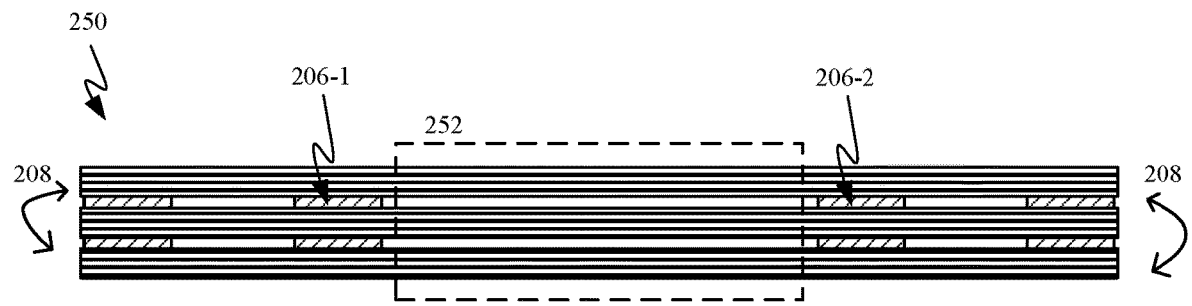
FIG. 2B shows a flexible battery with a larger interval between some spacing elements than other spacing elements.

FIG. 2B shows a flexible battery 250 with a larger interval between spacing elements 206-1 and 206-2 than between other spacing elements 206. This results in a flexible region 252 that can more easily accommodate folding and/or bending of flexible battery 250. This can be helpful for use in a device having a well-defined fold line.

Figure 3A:
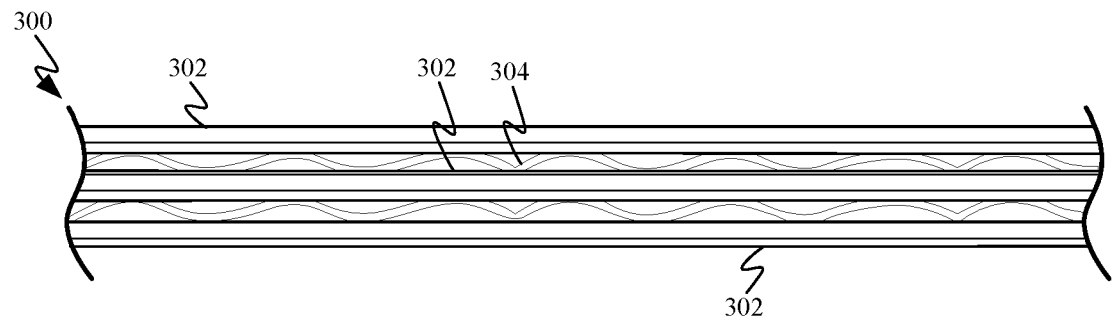
FIGS. 3A-3C show various views of a flexible battery having a corrugated structure.
Figure 3B:
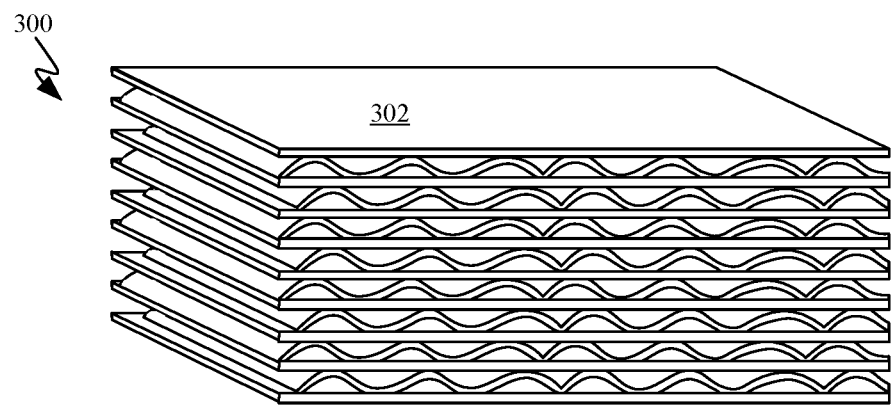
Figure 3C:
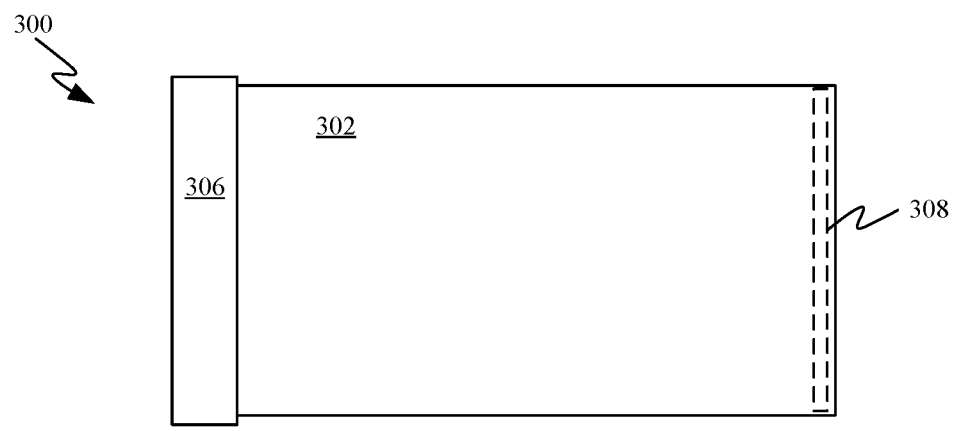

FIGS. 3A-3C show various views of a flexible battery 300 having a corrugated structure. FIG. 3A shows a cross-sectional side view of a portion of flexible battery 300, which includes multiple flexible battery cell layers 302. Corrugated or serpentine flexible battery cells 304 are positioned between each of flexible battery cell layers 302. Each one of serpentine flexible battery cells 304 creates an air gap between flexible battery cell layers 302. A shape of flexible serpentine battery cells 304 creates the air gap and by securing serpentine battery cells 304 to peripheral portions of flexible battery 300 a substantially unconstrained air gap can be created between each of the flexible battery cell layers. FIG. 3B shows a perspective view of a portion of flexible battery 300 and illustrates how a cross-section of each of flexible battery cells 304 have a substantially constant cross-sectional geometry for maintaining the gaps between flexible battery cell layers 302 and keeping flexible battery cell layers 302 substantially parallel to one another.

FIG. 3C shows a top view of flexible battery 300. Flexible battery 300 includes a battery management unit (BMU) 306 on one side of flexible battery 300. BMU 306 can be configured to control the operation of flexible battery 300. BMU 306 can also be operable to connect flexible battery to components utilizing power from flexible battery 300 and to components providing power to charge flexible battery 300. BMU 306 can be clamped to and constrain one end of flexible battery cell layers 302 and serpentine flexible battery cells 304. The opposite end of battery cell layers 302 and serpentine flexible battery cells can be joined together in attachment region 308, so that opposing sides of the battery cell layers are joined together. In some embodiments, an entire periphery of each of flexible battery cell layers 302 and serpentine flexible battery cells 304 can be joined together.

Figure 4A:
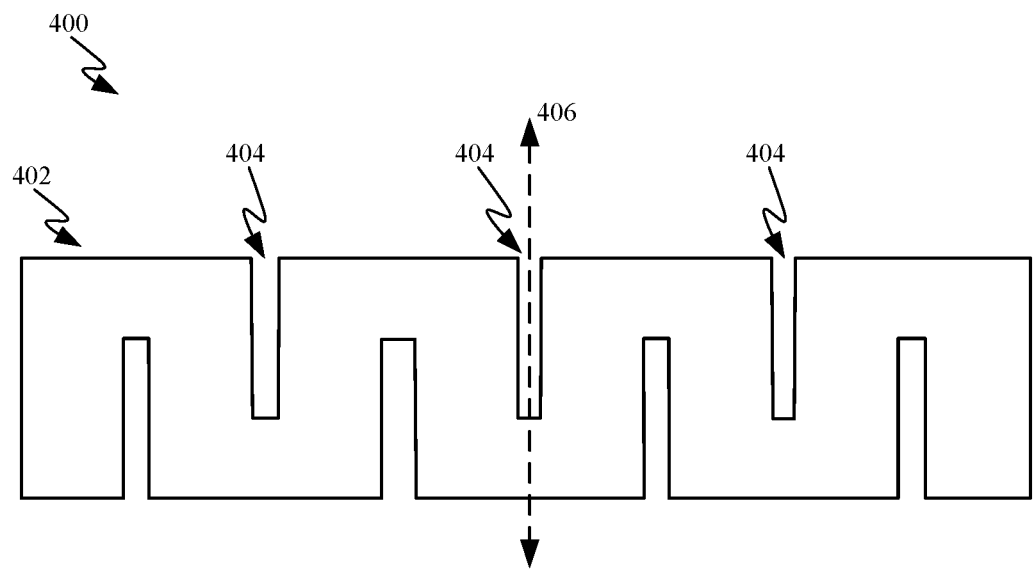
FIG. 4A shows a top view of a flexible battery cell.

FIG. 4A shows a top view of a flexible battery 400. Flexible battery 400 can be made up of a stack of flexible battery cells 402 that are die cut to define stress-relieving gaps 404. Each additional flexible battery cell 402 can increase the amount of energy flexible battery 400 is able to retain while also increasing the size and reducing the overall flexibility of flexible battery 400. Stress relieving gaps 404, staggered along a length of flexible battery 400, give flexible battery 400 a serpentine geometry accommodating bending about multiple axes of rotation. This type of configuration also allows adjacent portions of flexible battery cell 402 to bend in opposite directions to conform with various internal geometries of an electronic device associated with flexible battery cell 402. Notches defined by flexible battery cell 402 can take the form of stress relieving gaps 404 and can reduce residual stress build up that would otherwise result from bending flexible battery cell 402 in certain directions. Flexible battery 400 can bend around first axis of rotation 406. Flexible battery 400 accommodates the bending about axis 406 on account of axis of rotation 406 being aligned with one of stress-relieving gaps 404. Furthermore, flexible battery 400 could bend around an axis of rotation aligned with any of stress-relieving gaps 404.

Figure 4B:
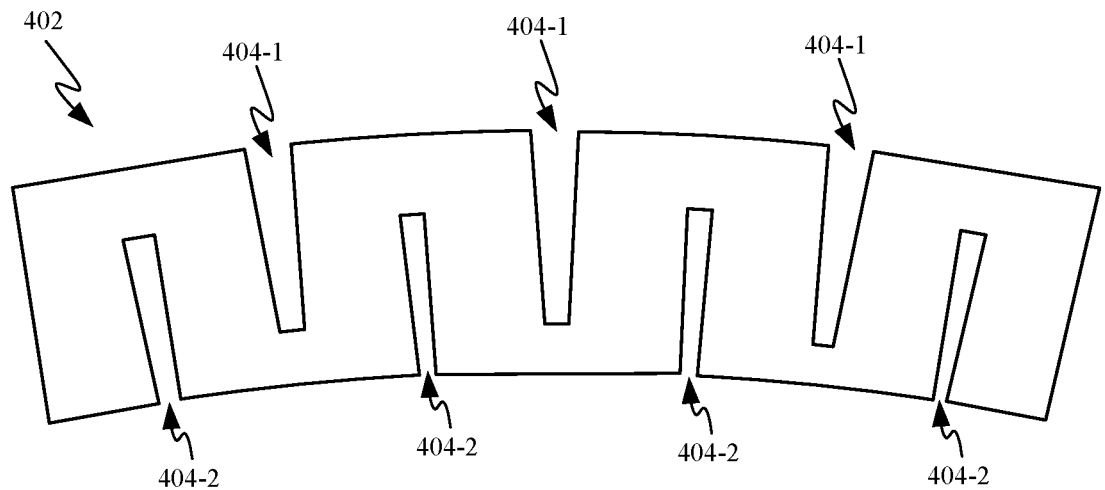
FIG. 4B shows how stress relieving gaps accommodate bending of the flexible battery cell depicted in FIG. 4A.

FIG. 4B shows how stress-relieving gaps 404-1 spread apart and stress relieving gaps 404-2 shrink to accommodate bending of flexible battery cell 402 about a second axis of rotation 408, which is oriented orthogonally with respect to first axis of rotation 406. Flexible battery 400 could also bend around an axis of rotation parallel to second axis of rotation 408 and positioned on an opposite side of flexible battery 400 from axis of rotation 408. Bending about flexible battery 400 in this way, stress-relieving gaps 404-1 would close up and stress-relieving gaps 404-2 would open to accommodate the bending.

Figure 4C:
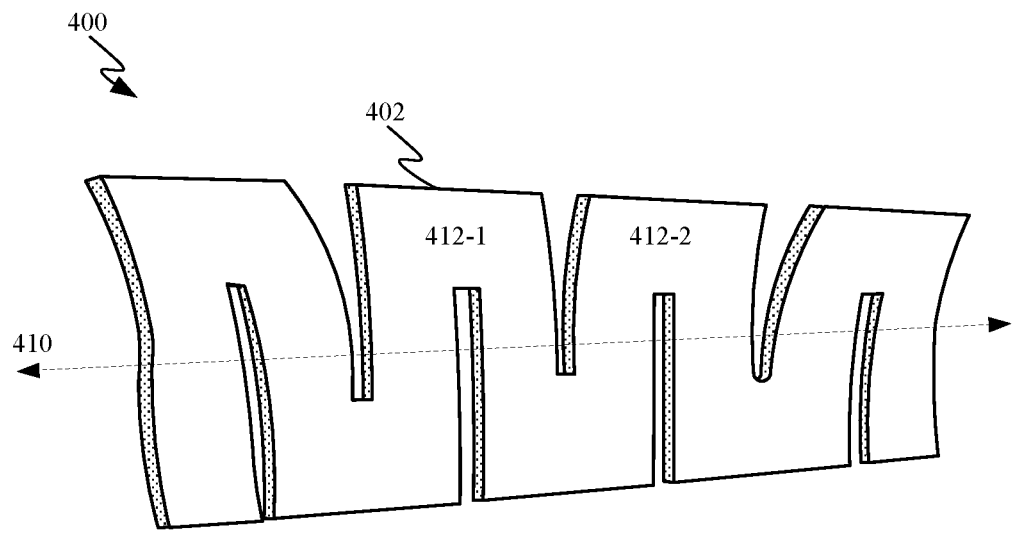
FIGS. 4C-4D show perspective views of the flexible battery cell depicted in FIGS. 4A-4B.
Figure 4D:
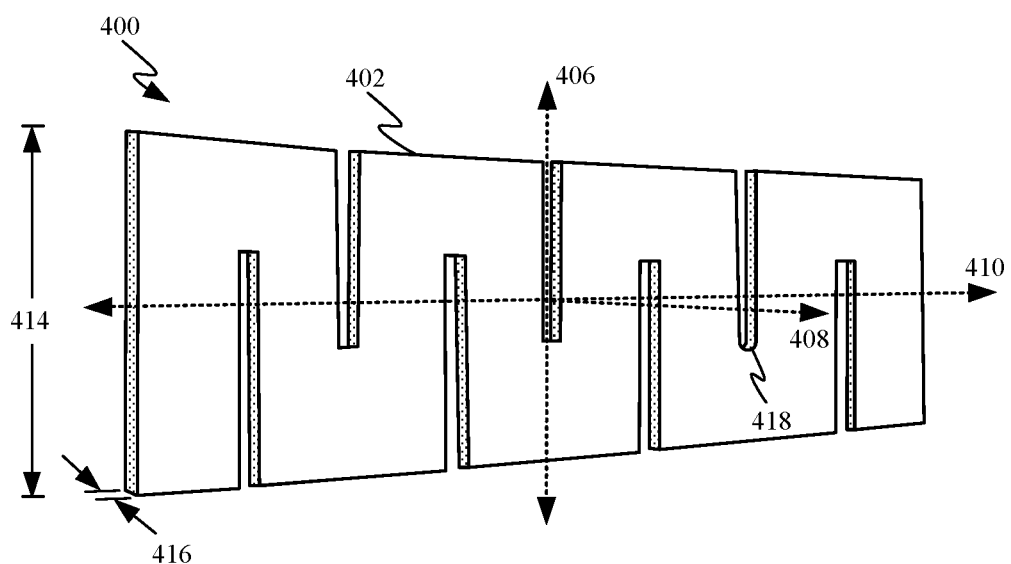

FIGS. 4C-4D show perspective views of flexible battery 400. FIG. 4C shows how stress-relieving gaps 404 can accommodate twisting of flexible battery 400 about a third axis of rotation 410 As described above, stress-relieving gaps 404 can help accommodate bending and twisting of flexible battery cells 402. In this configuration, adjacent curved segments 412-1 and 412-2 of flexible battery cell 402 can bend in different directions about axis of rotation 410. In some embodiments, where flexible battery 400 is formed from a larger number of flexible battery cells 402 a size of stress-relieving gaps 404 can be increased to help maintain the flexibility of flexible battery 400. For example, increasing the depth of stress-relieving gaps 404 can reduce the amount of resistance to bending flexible battery 400 about third axis of rotation 410. In some embodiments, stress relieving gaps 404 could extend up to 90% of the way across a height of flexible battery 400.

FIG. 4D shows flexible battery cell 402 can have a height 414 of about 2-3 mm and a thickness 416 of about 100-200 microns. In some embodiments, these numbers could be scaled with the same ratio of thickness 416 being about one tenth of height 414. It should be noted that while stress relieving gaps 404 are depicted as being rectangular in shape that the size and shape of stress-relieving gaps 404 can vary widely based on the application. For example, the corners of stress relieving gaps 404 could be rounded as depicted by rounded end 418 to reduce concentrations of force while bending or twisting flexible battery 400. FIG. 4D also shows orthogonal axes of rotation 406, 408 and 410 around any one of which or all of which flexible battery 400 can bend.

It should be understood that in some embodiments, the different flexible battery features can be combined to obtain desirable flexibility in specific areas of a battery. For example, a corrugated battery could also include some layers with spacing elements designed to keep the various layers more tightly bound to one another.

Figure 5A:
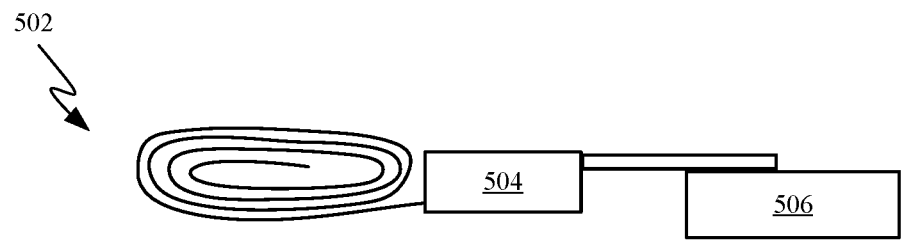
FIG. 5A shows a side view of an exemplary electronic device 500 suitable for use with the described embodiments.

FIG. 5A shows a side view of an exemplary electronic device 500 suitable for use with the described embodiments. Electronic device 500 can include flexible display 502, which is coupled to BMU 504 and BMU 504 is coupled to main logic board 506. BMU 504 can be configured to control the operation of a flexible battery integrated within flexible display 502. In some embodiments, flexible display 502 can include thin layers of graphite designed to dissipate and spread heat generated by operation of a display of flexible display assembly 502 and usage of the integrated flexible battery. The flexible battery can be distributed across flexible display 502 and allow flexible display 502 to transition from a rolled-up state as depicted in FIG. 5A to a flattened state as depicted in FIG. 5B.

Figure 5B:
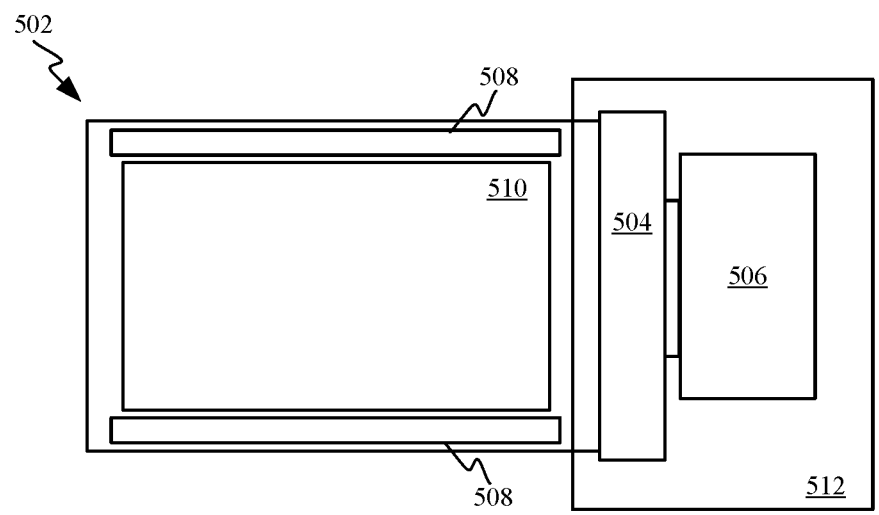
FIG. 5B shows how a flexible display assembly can include a flexible battery.

FIG. 5B shows how flexible display assembly 502 can include a flexible battery 508 that can be distributed on opposing sides of flexible display 510. In some embodiments, flexible battery 508 can be distributed along all four sides of flexible display 510. Flexible battery 508 can take the form of any of the aforementioned flexible battery configurations to accommodate transition of flexible display assembly 502 between the rolled and flattened configurations. For example, flexible battery 400 could be oriented within flexible display assembly 502 so that only its thickness 416 adds to the overall thickness of flexible display assembly 502. Flexible battery 400 can have the advantage of being able to bend in multiple axes, which can all flexible display assembly 502 to bend about more than just the axis flexible display assembly 502 is configured to roll. In some embodiments, the thickness of flexible battery 400 may not add to the overall thickness of flexible display assembly 502 at all, as flexible display 510 may have a similar or even greater thickness than flexible battery 400. It should be appreciated that BMU 504 and main logic board 506 may not be shown to scale. For example, BMU 504 and main logic board 506 could both be packaged within a housing 512 into which flexible display 502 is configured to retract by a retraction mechanism that results in flexible display being wound around a cylindrical member within housing 512. In this way, flexible display 510 and flexible battery 508 can make electronic device substantially more portable and easy to carry when not in active use.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling operation of the smart case and/or communication between the smart case and an electronic device disposed therein. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A battery, comprising:
   flexible battery cells arranged in a stack and having a serpentine geometry defined by notches staggered along a length of the battery that accommodates bending of the flexible battery cells about three orthogonal axes, each one of the flexible battery cells comprising:
   an anode layer;
   a cathode layer; and
   a separator joining the anode layer to the cathode layer.

2. The battery as recited in claim 1, wherein the notches extend across more than half a width of the flexible battery cells.

3. The battery as recited in claim 1, wherein a height of the flexible battery cells is more than ten times greater than a thickness of the flexible battery cells.

4. The battery as recited in claim 3, wherein a thickness of each one of the flexible battery cells is 100 to 200 microns.

5. The battery as recited in claim 1, wherein the flexible battery cells are prismatic battery cells.

6. An electronic device, comprising:
   a flexible housing member; and
   a flexible battery disposed within the flexible housing member, the flexible battery comprising:
   flexible battery cells arranged in a stack and defining stress-relieving gaps staggered along a length of the battery forming a serpentine geometry that accommodates bending of the flexible battery cells about multiple axes of rotation, each one of the flexible battery cells comprising an anode layer, a cathode layer and a separator disposed between the anode and cathode layers.

7. The electronic device as recited in claim 6, wherein the flexible housing member comprises a flexible display assembly.

8. The electronic device as recited in claim 7, wherein the flexible battery is positioned along a periphery of the flexible display assembly and the flexible display assembly is configured to transition from a flattened state to a rolled-up state.

9. The electronic device as recited in claim 7, wherein the flexible battery is a first flexible battery positioned on a first side of the flexible display assembly and the electronic device further comprises a second flexible battery positioned on a second side of the flexible display assembly, opposite the first side of the flexible display assembly.

10. The electronic device as recited in claim 6, wherein a height of the flexible battery cells arranged in a stack is more than ten times greater than a thickness of the flexible battery cells.

11. The electronic device as recited in claim 6, wherein the stress-relieving gaps are formed using a die cutting operation.

12. An electronic device, comprising:
    a device housing; and
    a display assembly, comprising:
    a flexible display; and
    flexible battery cells arranged in a stack and having a serpentine geometry defined by notches staggered along opposing sides of the flexible battery cells that accommodates bending of the flexible battery cells about three orthogonal axes, each one of the flexible battery cells comprising:
    an anode layer;
    a cathode layer; and
    a separator joining the anode layer to the cathode layer.

13. The electronic device as recited in claim 12, wherein the notches extend across more than half a width of the flexible battery cells.

14. The electronic device as recited in claim 12, wherein the display assembly is configured to transition between a rolled-up state in which the housing surrounds the display assembly to a flattened state in which at least a portion of the display assembly protrudes out of the device housing.

15. The electronic device as recited in claim 12, wherein the flexible battery cells are prismatic battery cells.

16. The electronic device as recited in claim 12, wherein the flexible battery cells are first flexible battery cells positioned on a first side of the flexible display and the electronic device further comprises second flexible battery cells positioned on a second side of the flexible display, opposite the first side.

17. The electronic device as recited in claim 16, further comprising a battery management unit, wherein the first and second flexible battery cells and are separately coupled to the battery management unit.

18. The electronic device as recited in claim 12, wherein a thickness of each of the flexible battery cells is between 100 and 200 microns.

* * * * *